US006969942B2

(12) United States Patent
Takeshima et al.

(10) Patent No.: US 6,969,942 B2
(45) Date of Patent: Nov. 29, 2005

(54) PIEZOELECTRIC ELECTROACOUSTIC TRANSDUCER

(75) Inventors: Tetsuo Takeshima, Toyama (JP); Takeshi Kishimoto, Toyama-ken (JP); Takashi Yamamoto, Hakui (JP); Kazuaki Hamada, Toyama-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/741,170

(22) Filed: Dec. 19, 2003

(65) Prior Publication Data

US 2004/0183407 A1 Sep. 23, 2004

Related U.S. Application Data

(63) Continuation of application No. 09/650,041, filed on Aug. 29, 2000, now Pat. No. 6,741,710.

(30) Foreign Application Priority Data

Jul. 10, 2000 (JP) ............................ 2000-207729

(51) Int. Cl.[7] .............................................. H01L 41/08
(52) U.S. Cl. ...................................... 310/324; 310/332
(58) Field of Search ........................ 310/324, 330–332, 310/344, 345, 348, 340, 346, 358, 366

(56) References Cited

U.S. PATENT DOCUMENTS 4,087,716 A 5/1978 Heywang
4,593,160 A 6/1986 Nakamura
5,053,671 A * 10/1991 Kobayashi et al. ......... 310/329
5,233,256 A * 8/1993 Hayashi et al. ............. 310/317
6,227,051 B1 * 5/2001 Otsuchi et al. .......... 73/514.34
6,255,037 B1 7/2001 Kanoh et al.
6,263,542 B1 * 7/2001 Larson et al. ................. 16/321
6,420,818 B1 * 7/2002 Kishimoto et al. ......... 310/324
6,472,797 B1 * 10/2002 Kishimoto .................. 310/324
6,472,798 B2 * 10/2002 Kishimoto .................. 310/344
6,741,710 B1 * 5/2004 Takeshima et al. ......... 381/190

FOREIGN PATENT DOCUMENTS

DE 31 46 986 A1 6/1983
DE 36 07 048 A1 9/1986
JP 60-30208 2/1985
JP 60-190100 9/1985
JP 61-205100 9/1986
JP 6-232469 8/1994
JP 2000-310990 * 7/2000

* cited by examiner

*Primary Examiner*—Mark Budd
(74) *Attorney, Agent, or Firm*—Keating & Bennett, LLP

(57) ABSTRACT

A piezoelectric electroacoustic transducer eliminates the need for the interconnection between main surface electrodes and internal electrodes, and is capable of constructing a bimorph diaphragm using a simple connection structure. The piezoelectric electroacoustic transducer includes a laminated body formed by laminating two or three piezoelectric ceramic layers, main surface electrodes each provided on the top and bottom main surfaces, and an internal electrode provided between any adjacent two piezoelectric ceramic layers. In the piezoelectric electroacoustic transducer, all ceramic layers are polarized in the same direction with respect to the thickness direction, and by applying an alternating voltage across the main surface electrodes and the internal electrode, the laminated body generates a bending vibration in its entirety.

8 Claims, 11 Drawing Sheets

PIEZOELECTRIC ELECTROACOUSTIC TRANSDUCER

This application is a Continuation of U.S. patent application Ser. No. 09/650,041 filed Aug. 29, 2000, now U.S. Pat. No. 6,741,710.

BACKGROUND OF THE INVENTION

1. Field of the Invention

The present invention relates to a piezoelectric electroacoustic transducer such as a piezoelectric receiver, piezoelectric sounder, piezoelectric speaker, and piezoelectric buzzer, and more particularly, to a diaphragm of a piezoelectric electroacoustic transducer.

2. Description of the Related Art

A piezoelectric electroacoustic transducer has been widely used for a piezoelectric receiver, piezoelectric buzzer, or other suitable device. This piezoelectric electroacoustic transducer typically includes a unimorph type diaphragm which is constructed by adhering a circular metallic plate to one surface of a circular piezoelectric ceramic plate, wherein the outer peripheral portion of the diaphragm is supported in a circular case, and wherein an opening of the case is closed by a cover. However, since the unimorph type diaphragm obtains bending vibration by adhering a ceramic plate, having an outer diameter that expands and contracts, to a metallic plate which does not change in size in accordance with a voltage application thereto, the unimorph type diaphragm has a drawback that the displacement thereof, and thus, the sound pressure thereof is minimal.

Japanese Unexamined Patent Application Publication No. 61-205100, discloses a bimorph type diaphragm having a laminated structure including a plurality of piezoelectric ceramic layers. This diaphragm utilizes a sintered body obtained by laminating a plurality of ceramic green sheets and a plurality of electrodes, and then simultaneously firing them. These electrodes of the diaphragm are electrically interconnected via through holes provided at positions which do not restrain the vibration of the diaphragm. By constructing the bimorph diaphragm so that first and second vibrational regions thereof disposed in succession in the thickness direction vibrate in opposite directions, a larger displacement, and thus, a larger sound pressure than that of a unimorph diaphragm is achieved.

In the above-described bimorph diaphragm, however, in order to vibrate the diaphragm including, for example, three ceramic layers in a bending mode, it is necessary to interconnect one main surface electrode with one internal electrode via a through hole, to interconnect the other main surface electrode with the other internal electrode via a through hole, and further to apply an alternating voltage between each of the main surface electrodes and a corresponding internal electrode, as shown in FIG. 17 in the above-described publication. This requires a complicated interconnection between main surface electrodes and internal electrodes, and thus, increases the production cost of the bimorph diaphragm.

In addition, when the laminated body is being polarized, a voltage must be applied between an internal electrode, and top and bottom main surface electrodes. For example, where a diaphragm has a three-layered structure, as shown in FIG. 14 in the above-described publication, two through holes electrically connected to an internal electrode are connected to a connection electrode, and polarization is performed by applying a high voltage between the connection electrode and the top and bottom main surface electrodes. The conventional bimorph diaphragm, thus, has a drawback that it requires extending the internal electrode outside via through holes in order to perform polarization, which requires a complicated process such as the formation of the connection electrode.

SUMMARY OF THE INVENTION

To overcome the above-described problems, preferred embodiments of the present invention provide a piezoelectric electroacoustic transducer which eliminates the need for the interconnection between main surface electrodes and internal electrodes, and which enables construction of a bimorph diaphragm using a simple connection structure.

Further, preferred embodiments of the present invention provide a piezoelectric electroacoustic transducer in which the polarization process is easily performed.

A first preferred embodiment of the present invention provides a piezoelectric electroacoustic transducer including a laminated body formed by laminating two or three piezoelectric ceramic layers, main surface electrodes each provided on the top surface and the bottom surface of the laminated body, and an internal electrode provided between adjacent piezoelectric ceramic layers. In this piezoelectric electroacoustic transducer, all of the ceramic layers are polarized in the same thickness direction, and by applying an alternating voltage across the main surface electrodes and the internal electrode, the laminated body generates a bending vibration.

In the laminated body according to preferred embodiments of the present invention, when an alternating voltage is applied between the main surface electrodes and the internal electrode, the directions of the electric field occurring on a ceramic layer on the top and bottom surfaces are opposite to each other in the thickness direction. On the other hand, the direction of the polarization of every ceramic layer is the same with respect to the thickness direction. If the direction of the polarization and that of the electric field are the same, the ceramic layer will contract in the direction of the plane, and if the direction of the polarization and that of the electric field are opposite to each other, the ceramic layer will expand in the direction of the plane. Therefore, if an alternating voltage is applied as described above, for example, when the top ceramic layer expands, the bottom ceramic layer contracts, which causes the laminated body to generate a bending vibration. Since the displacement of the diaphragm is larger than that yielded by a unimorph diaphragm, sound pressure generated by this diaphragm is substantially higher.

In preferred embodiments of the present invention, since bending vibration is generated by interconnecting the top and bottom main surface electrodes and applying an alternating voltage across the main surface electrodes and internal electrodes, unlike conventional diaphragms, a complicated interconnection between the main surface electrodes and internal electrodes is not required. This results in simplification of the structure and reduction in the manufacturing cost.

In accordance with the first preferred embodiment of the present invention, the internal electrode is connected to an end surface electrode provided on an end surface of the laminated body, and an alternating voltage is applied across the end surface electrode and two main surface electrodes. Therefore, additional machining, such as the formation of through holes, is not required.

Further, in accordance with the first preferred embodiment of the present invention, preferably, the laminated body includes three ceramic layers, and the thickness of an intermediate ceramic layer is between about 50 percent and about 80 percent of the overall thickness of the laminated body. To increase sound pressure, the number of ceramic layers of the laminated body may be increased, but where the thickness of the laminated body is fixed because of resonance frequency, the lamination number cannot be freely increased.

In a three-layered laminated body, since there is no potential difference between the two internal electrodes, the intermediate layer does not contribute to a bending vibration, and only the top and bottom ceramic layers vibrate in a bending mode. The thinner the ceramic layer is, the larger the displacement thereof is. Accordingly, if the overall thickness of the laminated body is set to a constant value and the thickness of the intermediate layer is greater than the thicknesses of the top and bottom ceramic layers, the thicknesses of the top and bottom ceramic layers contributing to a bending vibration are relatively thin, which results in increased displacement. If the intermediate ceramic layer is too thick, however, the top and bottom ceramic layers will be too thin, which reduces the strength thereof, leading to a failure to yield a large displacement. Therefore, by setting the thickness of the intermediate layer to about 50 percent to about 80 percent of the overall thickness of the laminated body, a much larger sound pressure is achieved.

Moreover, in accordance with the first preferred embodiment of the present invention, preferably, the laminated body is constituted of a sintered body obtained by laminating two or three ceramic green sheets via an electrode film, and simultaneously firing the laminated green sheets, and then all of the ceramic layers are polarized in the same direction with respect to the thickness direction by applying a voltage across the main surface electrodes provided on the top and bottom surfaces of the laminated body. Alternatively, the laminated body may be obtained by laminating and adhering a plurality of ceramic plates which have been previously fired and polarized. This method, however, does not produce a thin laminated body, which results in decreased sound pressure. In contrast, laminating ceramic layer sheets via an electrode film, and simultaneously firing the laminated ceramic layer sheets produces a laminated body which is very thin, which results in an increased sound pressure. In addition, since the polarization direction of each ceramic sheet of the laminated body is the same, the polarization process does not require the application of a voltage across the internal electrodes and the main surface electrodes, unlike the conventional method. That is, polarization is achieved by applying a voltage across only the top and bottom main surface electrodes, which greatly simplifies the polarization process.

When accommodating the laminated body in a housing, and using it as a sounding body such as a piezoelectric receiver or piezoelectric sounder, the laminated body preferably has a construction in accordance with a second preferred embodiment of the present invention. When preferred embodiments of the present invention are applied to a piezoelectric receiver, the laminated body is preferably used in the frequency range other than a resonance frequency range in order to respond to a wide range of frequencies. Therefore, the laminated body has a structure wherein only one set of opposing sides of the laminated body are supported in a case, and wherein the other set of opposing sides are displaceably sealed by an elastic sealant, such that the displacement is attained, although the vibrational energy of the laminated body is relatively small.

Where preferred embodiments of the present invention are applied to a piezoelectric sounder, the laminated body is used in a resonance frequency range in order to respond to a high-volume sound at a single frequency. In this case, to produce a very large vibrational energy of the laminated body, the laminated body is constructed such that all four sides of the laminated body are supported in a case.

In either of these structures, the main surface electrodes and the internal electrodes of the laminated body extend outside the housing without using lead wires, and therefore either structures can be constructed as a surface-mounting type component.

Other features, characteristics, elements and advantages of the present invention will become apparent from the following description of preferred embodiments thereof with reference to the attached drawings.

DETAILED DESCRIPTION OF PREFERRED EMBODIMENTS

Figure 1:
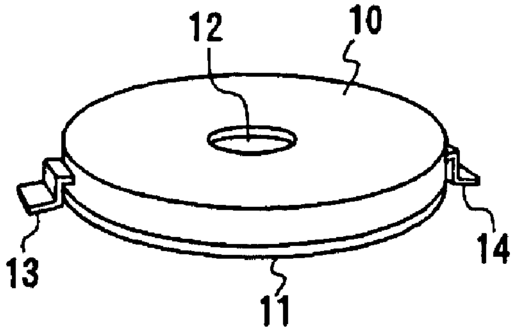
FIG. 1 is a perspective view showing a piezoelectric electroacoustic transducer in accordance with a first preferred embodiment of the present invention.
Figure 2:
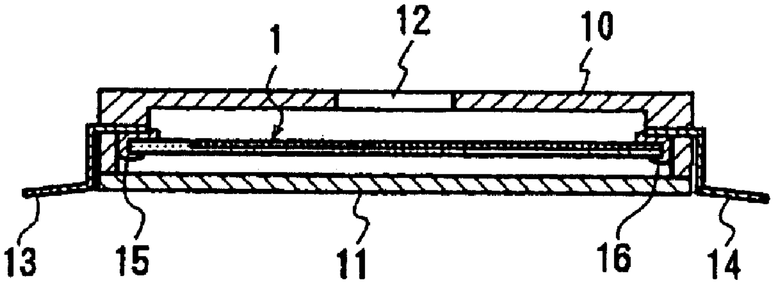
FIG. 2 is a cross-sectional view showing the piezoelectric electroacoustic transducer in FIG. 1.

FIGS. 1 and 2 show a piezoelectric electroacoustic transducer in accordance with a first preferred embodiment of the present invention. This piezoelectric electroacoustic transducer preferably includes a disk-shaped diaphragm (laminated body) 1, a substantially circular case 10 accommodating the diaphragm 1, and a bottom cover 11. A sound discharging hole 12 is provided on the top surface of the case 10, and the bottom cover 11 is adhered to an opening of the bottom surface of the case 10. External connection terminals 13 and 14 are provided at symmetric positions on the outer periphery of the case, and are fixed by insert moldings or other suitable fixing devices. Part of each of the terminals 13 and 14 extends to the inside of the case 10. The electrode of the diaphragm 1 is electrically connected to the internally exposed portions of the terminals 13 and 14 by conductive adhesives 15 and 16, respectively. The gaps provided between the case 10 and the outer periphery of the diaphragm 1 which are coated with the conductive adhesives 15 and 16 are sealed by an elastic sealant such as silicone rubber (not shown).

Figure 3:
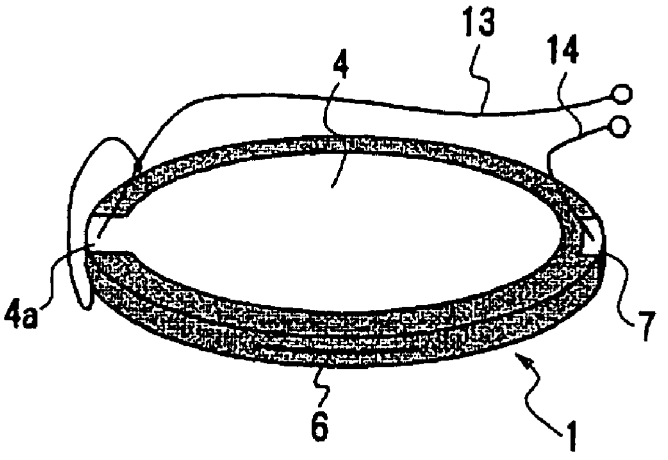
FIG. 3 is a perspective view showing a diaphragm used in the piezoelectric electroacoustic transducer in FIG. 1.
Figure 4:
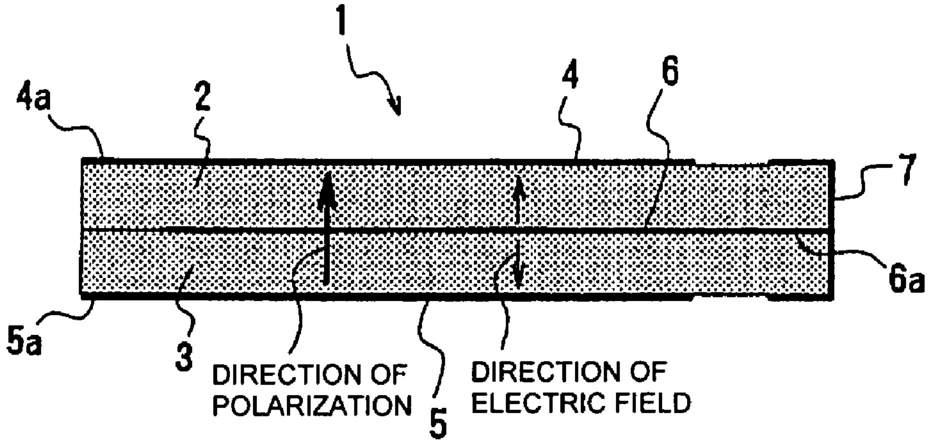
FIG. 4 is a cross-sectional view showing the diaphragm in FIG. 3.

As shown in FIGS. 3 and 4, the diaphragm 1 is constructed by laminating two piezoelectric ceramic layers 2 and 3 constituted preferably of PZT (Lead zirconate titanate) or other suitable material. Main surfaces 4 and 5 are provided on the top and bottom surfaces of the diaphragm 1, respectively, and an internal electrode 6 is provided between the ceramic layers 2 and 3. The two ceramic layers 2 and 3 are polarized in the same direction with respect to the thickness direction as shown with the boldface arrow in FIG. 4.

In this preferred embodiment, the top and bottom main surface electrodes 4 and 5 preferably have substantially circular shapes of which the diameters are slightly less than that of the diaphragm 1. Extraction electrodes 4*a* and 5*a* extend from the respective electrodes 4 and 5 to the outer peripheral edge of the diaphragm 1. The internal electrode 6 is substantially symmetric to the top and bottom main surface electrodes 4 and 5. An extraction electrode 6*a* of the internal electrode 6 extends to a position about which the extraction electrodes 4*a* and 5*a* are symmetric, and connected to an end surface electrode 7 provided on an end surface of the diaphragm 1. Portions of the end surface electrode 7 extend to the top and bottom surfaces of the diaphragm. The extracted electrodes 4*a* and 5*a* are connected with the terminal 13 via the conductive adhesive 15, and the end surface electrode 7 is connected with the terminal 14 via the conductive adhesive 16. Application of a alternating voltage between the terminals 13 and 14 causes the diaphragm 1 to vibrate in a bending mode.

For example, when a negative voltage is applied to one terminal 13 and a positive voltage is applied to the other terminal 14, electric fields are generated in the directions as shown with the lightface arrows in FIG. 4. If the direction of the polarization and that of the electric field are the same, the ceramic layers 2 and 3 will contract in the direction of the plane, while, if the direction of the polarization and that of the electric field are opposite to each other, the ceramic layer 2 and 3 will expand in the direction of the plane. Therefore, the ceramic layer 2 on the top side contracts, while the ceramic layer 3 on the bottom side expands. This causes the diaphragm 1 to be bent so that the central portion thereof becomes downwardly convex. Application of an alternating voltage between the terminals 13 and 14 causes the diaphragm 1 to periodically generate a bending vibration, which generates a sound having a high sound pressure.

The diaphragm 1 having the above-described features is produced preferably by the method as follows.

An electrode film is formed, by printing or other suitable electrode forming method, into a predetermined pattern on the surface of a ceramic green mother sheet, and this ceramic green mother sheet and a ceramic sheet which does not have an electrode film thereon are laminated and press-bonded.

Next, the laminated body is stamped out or cut out into a desired shape corresponding to that of the diaphragm 1.

Then, the laminated body which has been stamped out or cut out is simultaneously fired into a sintered body.

Next, main surface electrodes are provided on the top and bottom main surfaces of the sintered laminated body, and a polarization voltage is applied across these main surface electrodes such that all of the ceramic layers constituting the laminated body are polarized in the same direction with respect to the thickness direction.

Thereafter, the end surface electrodes 7 are formed, and thus, the diaphragm 1 is produced.

In the above method, after the ceramic green sheet in the state of a mother sheet is stamped out into individual patterns, the individual patterns are fired and thereafter are polarized. Alternatively, however, the fired laminated ceramic green sheet may be polarized in the state of a mother sheet after being fired, and then the polarized sheet may be cut out into individual shapes. In this case, a known method such as laser beam machining may be used in order to cut out the sintered body.

Figure 5:
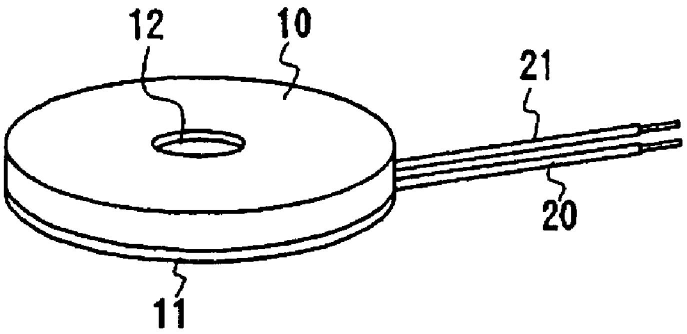
FIG. 5 is a perspective view showing a piezoelectric electroacoustic transducer in accordance with a second preferred embodiment of the present invention.
Figure 6:
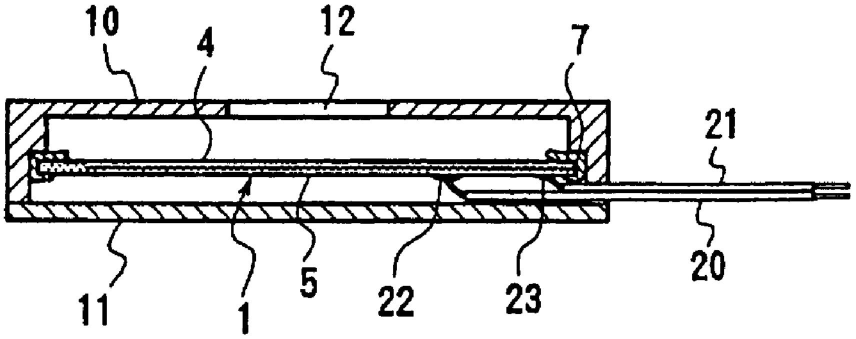
FIG. 6 is a cross-sectional view showing the piezoelectric electroacoustic transducer in FIG. 5.

FIGS. 5 and 6 show a piezoelectric electroacoustic transducer in accordance with a second preferred embodiment of the present invention. In the first preferred embodiment, as shown in FIGS. 1 and 2, electrodes of the diaphragm 1 extend to the outside using the terminals 13 and 14 fixed to the case 10, while in the second preferred embodiment, as shown in FIGS. 5 and 6, lead wires 20 and 21 are used in place of the terminals 13 and 14. In this case, the lead wires 20 and 21 are connected to the bottom main surface electrode 5 and the end surface electrode 7, respectively, via bonding agents 22 and 23 such as solder, a conductive adhesive, or other suitable agent. To achieve this, the top and bottom main surface electrodes 4 and 5 are connected to each other via the conductive adhesive. Alternatively, the main surface electrodes 4 and 5 may be previously connected to each other via an end surface electrode.

Figure 7:
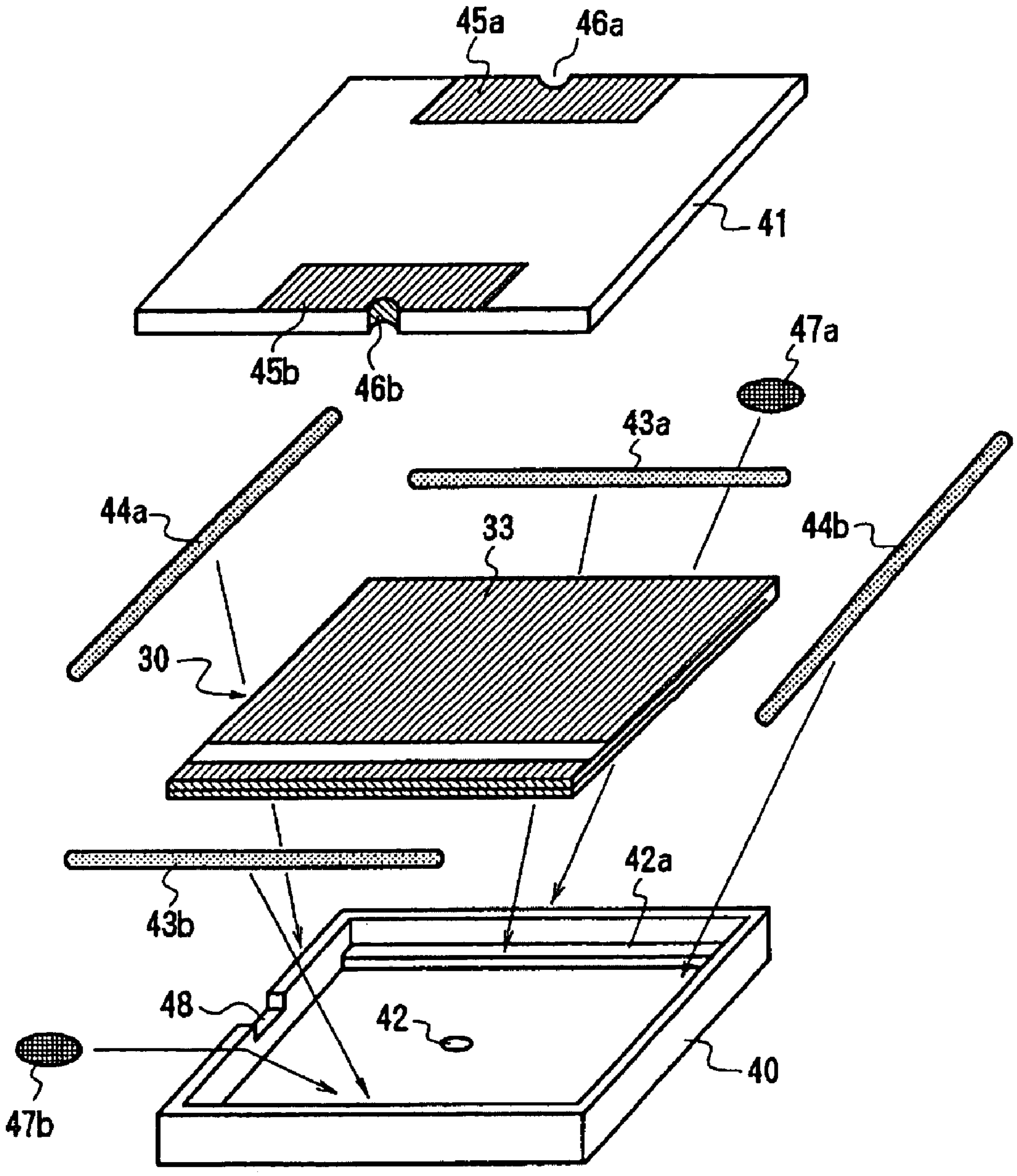
FIG. 7 is a exploded perspective view showing the piezoelectric electroacoustic transducer in accordance with a third preferred embodiment of the present invention, as viewed from the back side thereof.
Figure 8:
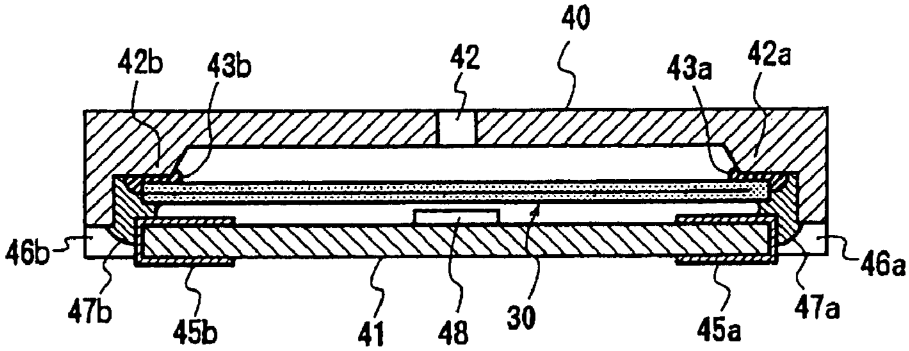
FIG. 8 is a cross-sectional view showing the piezoelectric electroacoustic transducer in FIG. 7.

FIGS. 7 and 8 show a piezoelectric electroacoustic transducer in accordance with a third preferred embodiment of the present invention.

This piezoelectric electroacoustic transducer preferably includes a substantially rectangular diaphragm (laminated body) 30, a substantially rectangular case 40 accommodating the diaphragm 30, and bottom cover 41. A sound discharging hole 42 is provided on the top surface of the case 40, and the bottom cover 41 is adhered to an opening of the bottom surface of the case 40. Step-shaped supporting members 42*a* and 42*b* are provided on the inner side surfaces of two opposing sides of the case 40. The two shorter sides of the diaphragm 30 are supported on these supporting members 42*a* and 42*b* by supporting agents 43*a* and 43*b* such as adhesives. A damping hole 48 is formed in a side surface other than the side surfaces where the supporting members 42*a* and 42*b* of the case 40 are provided. The gaps provided between the two longer sides of the diaphragm 30 and the case 40 are sealed with elastic sealants 44*a* and 44*b* such as silicone rubber. External connection electrodes 45*a* and 45*b* are provided on the top and bottom surfaces of two ends of the bottom cover 41. The top and bottom surfaces of each of the electrode 45*a* and 45*b* are connected to each other via through holes 46*a* and 46*b*, formed at the side edge of the two ends of the bottom cover 41.

After the bottom cover 41 has been adhered to the opening of the bottom surfaces of the case 40, conductive adhesives 47*a* and 47*b* are poured through the through holes 46*a* and 46*b*, as shown in FIG. 8. Thereby the external connection electrodes 45*a* and 45*b* and the electrodes of the diaphragm 30 are interconnected, and the through hole is sealed. The piezoelectric electroacoustic transducer is thus produced.

Figure 9:
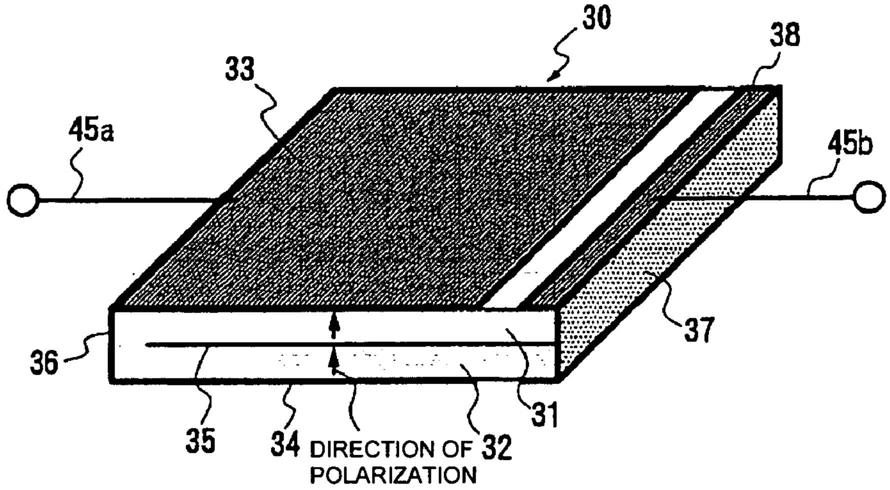
FIG. 9 is a perspective view showing a diaphragm used in the piezoelectric electroacoustic transducer in FIG. 7.
Figure 10:
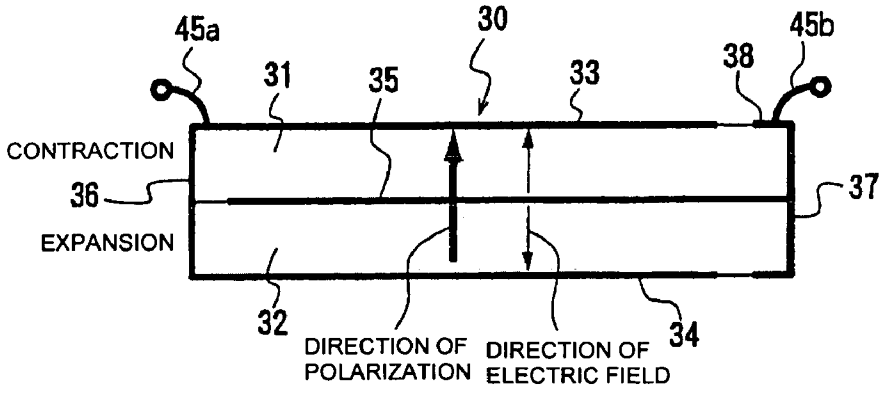
FIG. 10 is a cross-sectional view showing the diaphragm in FIG. 9.

As shown in FIGS. 9 and 10, the diaphragm 30 of this preferred embodiment is obtained by laminating two piezoelectric ceramic layers 31 and 32. Main surface electrodes 33 and 34 are provided on the top and bottom surfaces of the diaphragm 30, respectively, and an internal electrode 35 is provided between the ceramic layers 31 and 32. The two ceramic layers 31 and 32 are polarized in the same direction with respect to the thickness direction as shown with the boldface arrow in FIG. 10.

In this preferred embodiment, the top main surface electrode 33 and the bottom main surface electrode 34 are arranged so that the widths thereof are each substantially equal to the shorter side of the diaphragm 30 and the lengths thereof are each somewhat shorter than the longer side of the diaphragm 30. One end of each of the top and bottom main surface electrodes 33 and 34 is connected to an end electrode 36 provided on the end surface on one of the shorter sides of the diaphragm 30. The top and bottom main surface electrodes 33 and 34 are, therefore, connected to each other. The internal electrode 35 is arranged to have a substantially symmetric shape with the main surface electrodes 33 and 34. One end of the internal electrode 35 is spaced from the end electrode 36, while the other end thereof is connected to an end electrode 37 provided on the end surface on the other of the shorter sides of the diaphragm 30. A relatively narrow auxiliary electrode 38 connected with the end surface electrode 37 is provided on the top and bottom surfaces of an end portion on the side of the other of the shorter sides of the diaphragm 30.

As shown in FIGS. 8 and 9, the end surface electrode 36 or the bottom main surface electrode 34 is connected to the external connection electrode 45*a* via the conductive adhesive 47*a*, and the end surface electrode 37 is connected to the end surface electrode 45*b* via the conductive adhesive 47*b*. By applying a desired alternating voltage between the external connection electrodes 45*a* and 45*b*, the diaphragm 30 vibrate in a longitudinal bending mode, wherein the shorter sides of thereof serve as fulcrums and wherein the maximum amplitude is obtained at the approximate central portion thereof in the longitudinal direction.

In the substantially circular diaphragm 1 of the first preferred embodiment, since the maximum amplitude is obtained only at the approximate central portion thereof, the displacement volume thereof is relatively small and the electroacoustic conversion efficiency thereof is relatively low. Also, because the movement of the outer periphery of the diaphragm 1 is restricted, the vibrational frequency thereof is relatively high. Accordingly, to obtain a piezoelectric diaphragm having a low vibrational frequency, the radius of the diaphragm 1 must be increased. On the other hand, in the substantially rectangular diaphragm 30 in the third preferred embodiment, because the maximum amplitude is obtained along the centerline thereof in the longitudinal direction, the displacement volume thereof is relatively large, and thereby a relatively high electroacoustic conversion efficiency is achieved. Furthermore, although both end portions of the diaphragm 30 in the longitudinal direction are fixed, the elastic sealants 44*a* and 44*b* permits those end portions of the diaphragm 30 to be freely displaced, and thereby provides a lower vibrational frequency than that of the substantially circular diaphragm. Conversely, when the vibrational frequency of the circular diaphragm and that of the rectangular diaphragm are the same, the substantially rectangular diaphragm is smaller in size than the substantially circular diaphragm.

Figure 11:
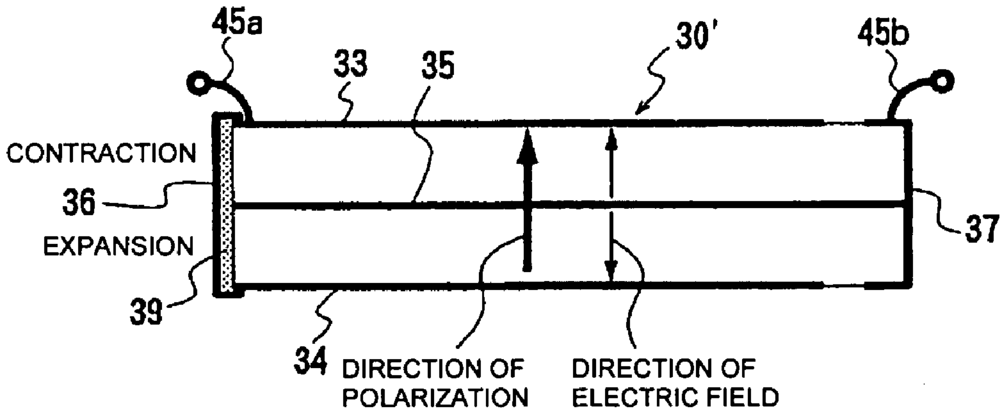
FIG. 11 is a cross-sectional view showing the diaphragm in accordance with a fourth preferred embodiment of the present invention.

FIG. 11 shows a diaphragm in accordance with a fourth preferred embodiment of the present invention, which is a variation of that shown in FIG. 10.

In FIG. 10, the internal electrode 35 is a partial electrode, but in FIG. 11, the internal electrode 35 is an entire electrode. In this case, since the entire electrode 35 extends up to the end surface electrode 36, there is a risk that the internal electrode will contact with the end surface electrode 36. To avoid this risk, an insulating layer 39 is provided on an end surface of a diaphragm 30', and then the end surface electrode 36 which connects the main surface electrodes 33 and 34 is provided on the insulating layer 39. Thereby, even when the internal electrode 35 is an entire electrode, the internal electrode 35 is reliably insulated from the main surface electrodes 33 and 34.

Figure 12:
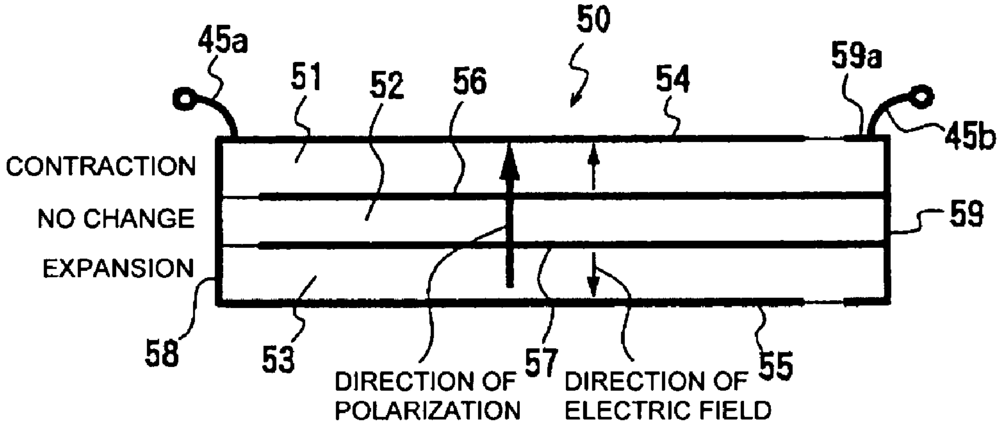
FIG. 12 is a cross-sectional view showing the diaphragm in accordance with a fifth preferred embodiment of the present invention.

FIG. 12 shows a diaphragm in accordance with a fifth preferred embodiment of the present invention.

The diaphragm 50 in this preferred embodiment is made by laminating three piezoelectric ceramic layers 51 through 53. In the diaphragm 50, main surface electrodes 54 and 55 are provided on the top and bottom surfaces of the diaphragm 50, respectively, and internal electrodes 56 and 57 are provided between the ceramic layers 51 and 52, and between the ceramic layers 52 and 53, respectively. These three ceramic layers are polarized in the same direction with respect to the thickness direction as shown with the boldface arrow in FIG. 12.

In this preferred embodiment, in the same manner as shown in FIG. 10, the main surface electrodes 54 and 55 are provided so that the widths thereof are each substantially equal to that of the shorter side of the diaphragm 50, and the lengths thereof are somewhat shorter than the longer side of the diaphragm 50. One end of each of the top and bottom main surface electrodes 54 and 55 is connected to an end surface electrode 58 provided on the end surface on one of the shorter sides of the diaphragm 50. The top and bottom main surface electrodes 54 and 55 are, therefore, connected to each other. One end of each of the internal electrodes 56 and 57 is spaced from the end electrode 58, and the other end thereof is connected to an end surface electrode 59 provided on the end surface on the other of the shorter sides of the diaphragm 50. The internal electrodes 56 and 57, therefore, are also connected to each other.

A narrow auxiliary electrode 59*a* connected with the end surface electrode 59 is provided on the top and bottom surfaces of an end portion on the side of the other of the shorter sides of the diaphragm 50.

When a negative voltage and a positive voltage are applied to the end surface electrodes 58 and 59, respectively, electric fields are generated in the directions as shown with the lightface arrows in FIG. 12. At this time, since the internal electrodes 56 and 57 located on opposite sides of the intermediate ceramic layer 52 have equal electric potential, they generate no electric field. The ceramic top layer 51 contracts in the direction of the plane since the direction of the polarization and that of the electric field of the top ceramic layer 51 are the same, while the bottom ceramic layer 53 expands in the direction of the plane since the direction of the polarization and that of the electric field of the ceramic bottom layer 53 are opposite to each other. The intermediate ceramic layer 52 neither expands nor contracts. Accordingly, the diaphragm 50 is bent to be downwardly convex. By applying an alternating voltage between the end surface electrodes 58 and 59, it is possible to periodically vibrate the diaphragm in a bending mode, to thereby generate a high sound pressure.

In FIG. 12, as the internal electrodes 56 and 57, partial electrodes are used, but entire electrodes may also be used as shown in FIG. 11.

The manufacturing method for the above-described diaphragm 50 having the three-layered structure is preferably the same as that for the two-layered diaphragm 1 shown in FIG. 4. That is, an electrode film is formed into a predetermined pattern by printing or other suitable method on the surface of a ceramic green sheet in the state of a mother sheet, and three of these ceramic sheets are laminated and press-bonded. Next, this laminated body is stamped out or cut out into the shape corresponding to that of the diaphragm 50. Then, the laminated body which has been stamped out or cut out is simultaneously fired into a sintered laminated body.

Next, main surface electrodes 54 and 55 are provided on the top and bottom main surfaces of the sintered laminated body, and by applying a polarization voltage across these main surface electrodes, all of the ceramic layers 52 through 53 of the laminated body are polarized in the same direction with respect to the thickness direction.

Thereafter, the end surface electrodes 58 and 59 are provided, and thus, the diaphragm 50 is achieved.

In this case, interconnection between the internal electrodes 56 and 57, and the main surface electrodes 54 and 55 is not required when performing the polarization. Polarization is performed by merely applying a voltage across the main surface electrodes 54 and 55. This simplifies the polarization process.

Figure 13:
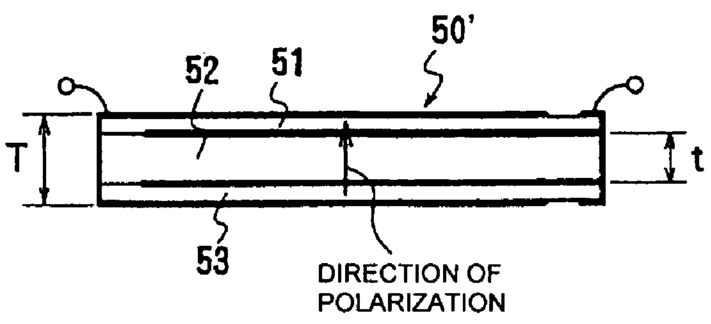
FIG. 13 is a cross-sectional view showing the diaphragm in accordance with a sixth preferred embodiment of the present invention.

FIG. 13 shows a diaphragm in accordance with a sixth preferred embodiment of the present invention.

The preferred embodiment shown in FIG. 12 is a diaphragm wherein the thickness of all of the ceramic layers 51 through 53 are substantially the same. Alternatively, the preferred embodiment shown in FIG. 13 is a diaphragm wherein the intermediate ceramic layer 52 is thicker than the ceramic layers 51 and 53. It is particularly preferable that the thickness of the intermediate ceramic layer 52 occupy about 50 percent to about 80 percent of the overall thickness of the diaphragm 50' Here, since the structure of the diaphragm 50' is otherwise the same as that of the diaphragm 50 shown in FIG. 12, description thereof will be omitted.

Figure 14:
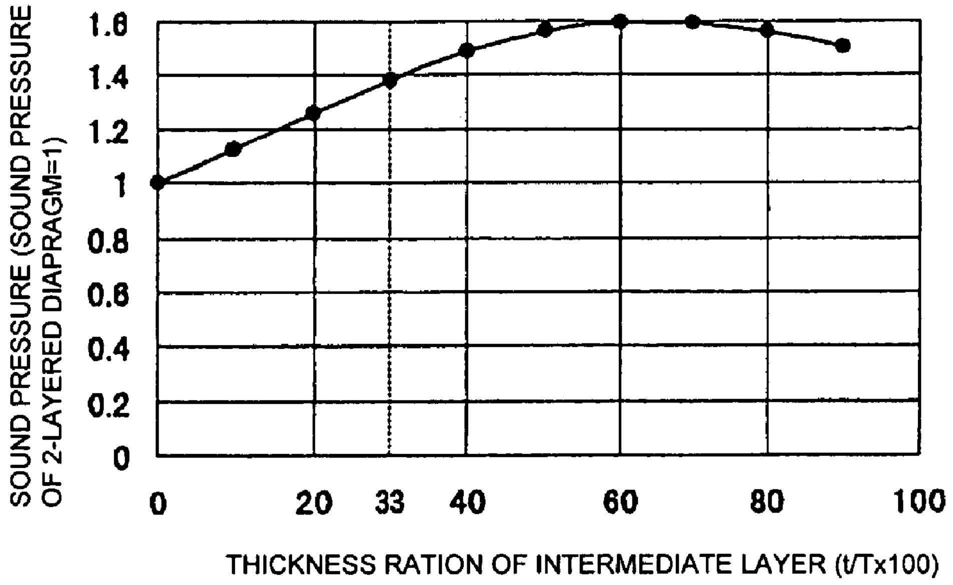
FIG. 14 is a characteristic view showing the relationship between the thickness of the intermediate layer of the piezoelectric electroacoustic transducer including the diaphragm in FIG. 13 and the sound pressure.

FIG. 14 shows the change in the sound pressure in accordance with the change in the thickness ratio of the intermediate ceramic layer 52. The vertical axis represents the ratio of the sound pressure of the diaphragm 50' with respect to that of the two-layered diaphragm as shown in FIG. 10. The horizontal axis represents the ratio of the thickness of the intermediate ceramic layer 52 with respect to the overall thickness of the diaphragm 50'. Sound pressures of the diaphragm 50' were measured under the conditions in which the overall thickness of the diaphragm 50' is constant and the applied voltage is constant.

As is evident from FIG. 14, a higher sound pressure is obtained in the three-layered diaphragm than in the two-layered diaphragm. In addition, even higher sound pressure is obtained in the case where the thickness ratio is between about 50 percent and about 80 percent than in the case where the thickness of each of the three layers is equal (i.e., when the thickness ratio is about 33 percent). Notably, when the thickness ratio is between about 60 percent and about 70 percent, the maximum sound pressure is obtained, which is about 1.6 times as high as the sound pressure obtained by the two-layered diaphragm. Where the lamination number is limited, therefore, it is possible to increase the sound pressure up to the maximum value thereof by increasing the thickness of the intermediate layer while minimizing the lamination number (3 layers in this example).

Figure 15:
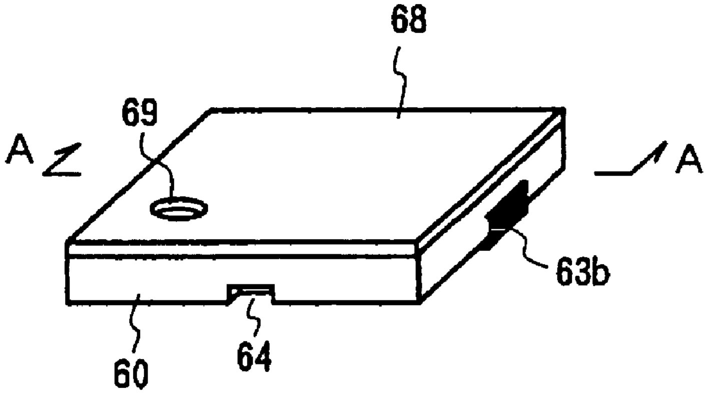
FIG. 15 is a perspective view showing a piezoelectric electroacoustic transducer in accordance with a seventh preferred embodiment of the present invention.
Figure 16:
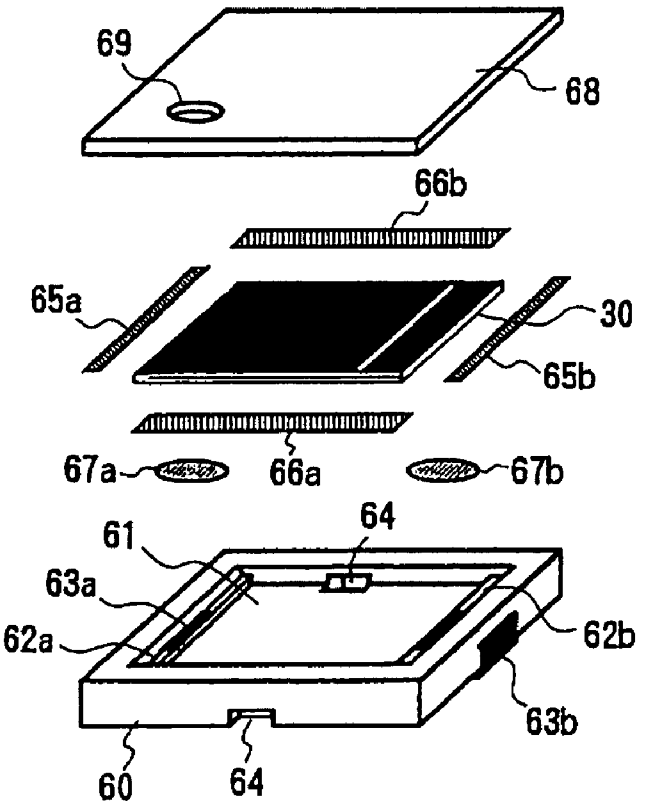
FIG. 16 is a exploded perspective view showing the piezoelectric electroacoustic transducer in FIG. 15.
Figure 17:
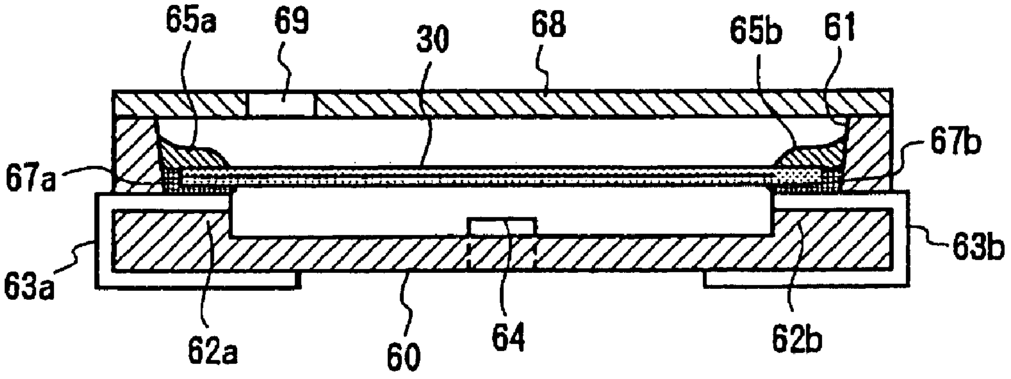
FIG. 17 is a cross-sectional view taken along a line A—A in FIG. 15.

FIGS. 15 through 17 shows a piezoelectric electroacoustic transducer in accordance with a seventh preferred embodiment of the present invention, which is constructed as a surface-mounting type piezoelectric receiver.

This piezoelectric receiver includes a substantially rectangular diaphragm (laminated body) 30, a substantially rectangular case 60 accommodating this diaphragm 30, a top cover 68 having a discharging hole 69. Since the diaphragm 30 is the same as that shown in FIGS. 9 and 10, the same elements as those in FIGS. 9–10 are identified by the same reference numerals. The case 60 is preferably made of a heat-resistant resin such as LCP (liquid crystal polymer), SPS (syndiotatic polystyrene), PPS (polyphenylene sulfide), epoxy or other suitable material. The top cover 68 is made of a heat-resistant material such as liquid crystal polymer, glass epoxy or other suitable heat-resistant material, or made of a ceramic. An opening 61 is provided on the top surface of the case 60, and a top cover 68 is adhered to this top surface opening 61. Step-shaped supporting members 62*a* and 62*b* are provided on the inner side surfaces of two opposing sides of the case 60. External connection terminals 63*a* and 63*b* are insert-molded so as to be exposed to the top surface of the supporting members 62*a* and 62*b* and the outer side surfaces of the case 60. These external connection terminals 63*a* and 63*b* are constructed by, for example, Au-plating or Sn-plating metallic terminals constituted of Cu alloy, Fe, or other suitable method. A damping hole 64 is provided in a side surface other than the side surfaces where the supporting members 62*a* and 62*b* of the case 60 are provided.

The two shorter sides of the diaphragm 30 are supported on the supporting member 62*a* and 62*b* by supporting agents 65*a* and 65*b*. The gaps provided between the two longer sides of the diaphragm 30 and the case 60 are sealed with elastic sealants 66*a* and 66*b* such as silicone rubber. The end surface electrodes 36 and 37 provided on the shorter sides of the diaphragm 30 are electrically connected with the external connection electrodes 63*a* and 63*b* exposed to the top surface of the supporting members 62*a* and 62*b*, via the conductive pastes 67*a* and 67*b*, respectively. Preferably, the application of supporting agents 65*a* and 65*b*, and elastic sealants 66*a* and 66*b* is performed after the diaphragm 30 and the external connection electrodes 63*a* and 63*b* have been adhered by the conductive pastes 67*a* and 67*b*. Heat-curing of the conductive pastes 67*a* and 67*b*, the supporting members 65*a* and 65*b*, and the elastic sealants 66*a* and 66*b* may be simultaneously performed.

Figure 18:
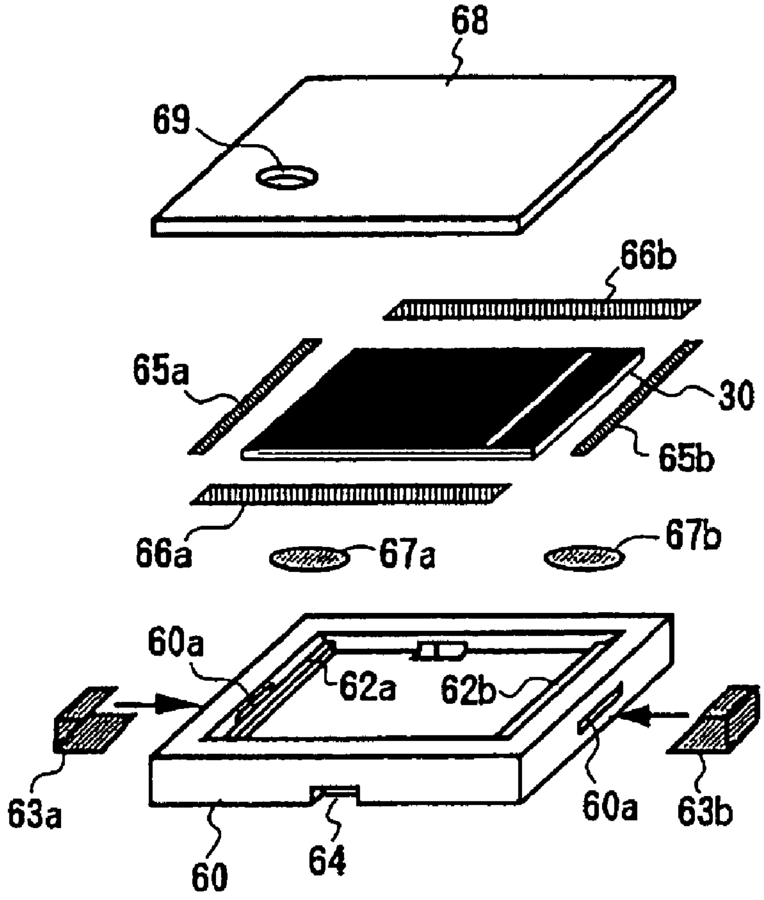
FIG. 18 is a exploded perspective view showing the piezoelectric electroacoustic transducer in accordance with a eighth preferred embodiment of the present invention.

FIG. 18 shows a piezoelectric electroacoustic transducer in accordance with a eighth preferred embodiment of the present invention, which is a variation of that shown in FIGS. 15 through 17.

This preferred embodiment is not constructed by inserting the external connection electrodes 63*a* and 63*b* into the case 60, but is constructed by inserting metallic terminals provided as separate ones into the holes 60*a* of the case 60 and adhering the metallic terminals to the holes 60*a*. Since other structures are the same as those shown in FIGS. 15 through 17, the same elements as those in FIGS. 15–17 are identified by the same reference numerals, to avoid repeated descriptions.

Figure 19:
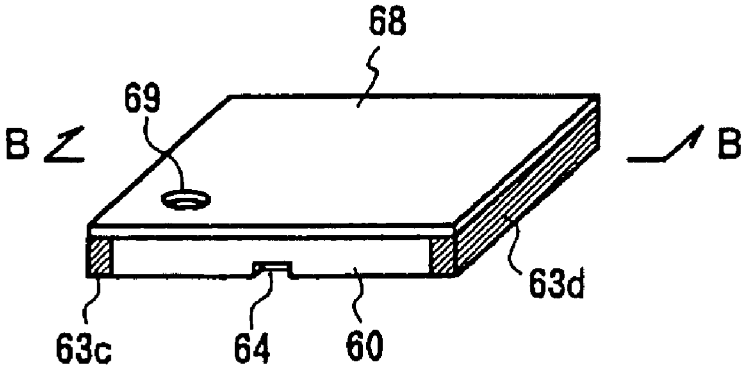
FIG. 19 is a perspective view showing the piezoelectric electroacoustic transducer in accordance with a ninth preferred embodiment of the present invention.
Figure 20:
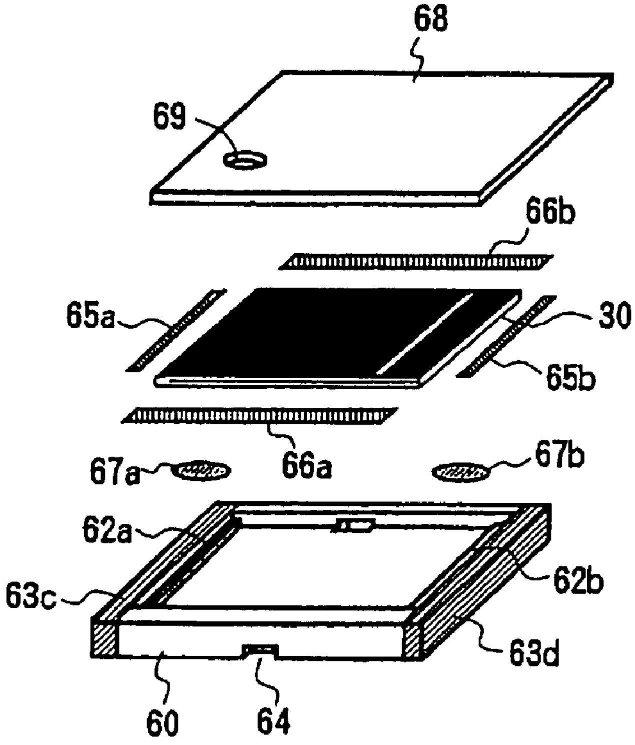
FIG. 20 is a exploded perspective view showing the piezoelectric electroacoustic transducer in FIG. 19.
Figure 21:
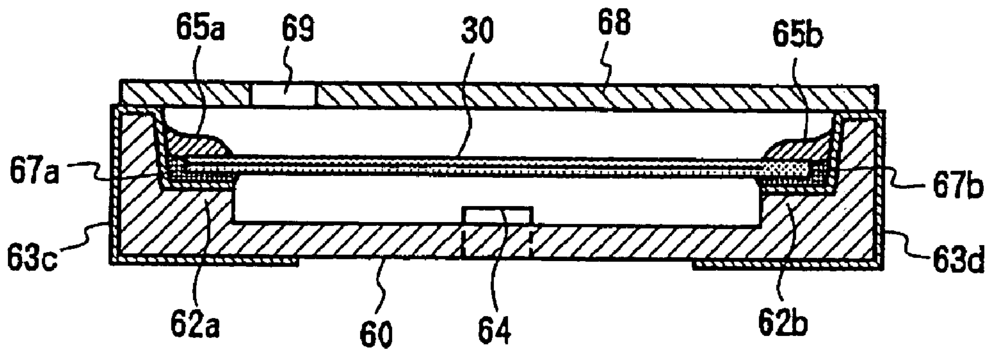
FIG. 21 is a cross sectional view taken along a line B—B in FIG. 19.

FIGS. 19 through 21 shows a piezoelectric electroacoustic transducer in accordance with a ninth preferred embodiment of the present invention, which is constructed as a surface-mounting type component.

This preferred embodiment uses electrode films 63*c* and 63*d* formed by electroless wet plating method or dry plating such as sputtering, in place of the external connection electrodes 63*a* and 63*b* constituted of the insert terminals in FIGS. 15 through 17. In this preferred embodiment, the electrode films 63*c* and 63*d* are continuously provided from the outer surfaces of the sides on which the supporting members 62*a* and 62*b* are provided to the top surfaces of the supporting members 62*a* and 62*b*.

Since other structures are the same as those shown in FIGS. 15 through 17, the same elements as those in FIGS. 15 through 17 are identified by the same reference numerals, to avoid repeated descriptions.

In the preferred embodiments shown in FIGS. 15 through 21, not only the diaphragm 30 shown in FIGS. 9 and 10, but the diaphragm 30', 50, and 50' shown in FIGS. 11, 12, and 13, respectively, may also be used as a diaphragm.

Figure 22:
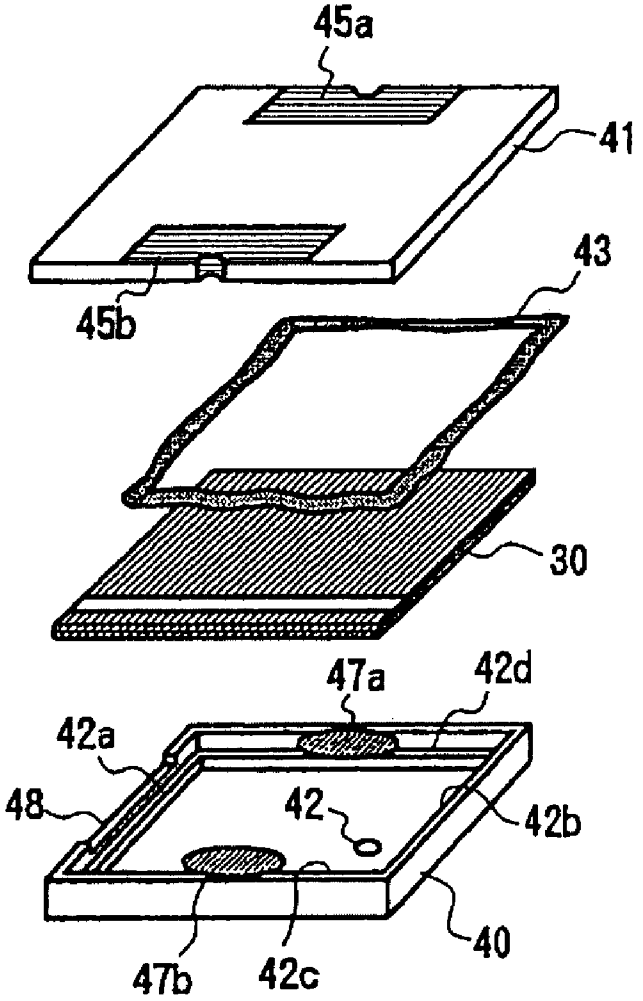
FIG. 22 is a exploded perspective view showing the piezoelectric electroacoustic transducer in accordance with a tenth preferred embodiment of the present invention.

FIG. 22 shows a piezoelectric electroacoustic transducer in accordance with a tenth preferred embodiment of the present invention, which is a variation of that shown in FIG. 7. The same elements as those in FIG. 7 are identified by the same reference numerals, to avoid repeated descriptions.

FIG. 22 is a perspective view showing this preferred embodiment as viewed from the bottom side. Step-shaped supporting members 42 are provided all around the inner side surface of a case 40. The top surfaces of these supporting members 42 are configured so as to be flush to each other, and all of the four sides of the diaphragm 30 are supported on the supporting members 42 by supporting agents 43 such as an adhesive, or other suitable agent.

This preferred embodiment is used as a sounder operable at a single frequency, such as a piezoelectric sounder. Although the diaphragm 30 is restrained at the entire perimeter thereof by the supporting agent 43, use of the diaphragm 30 in the resonance frequency range permits the diaphragm 30 to be strongly excited, which results in a high-level sound.

Figure 23:
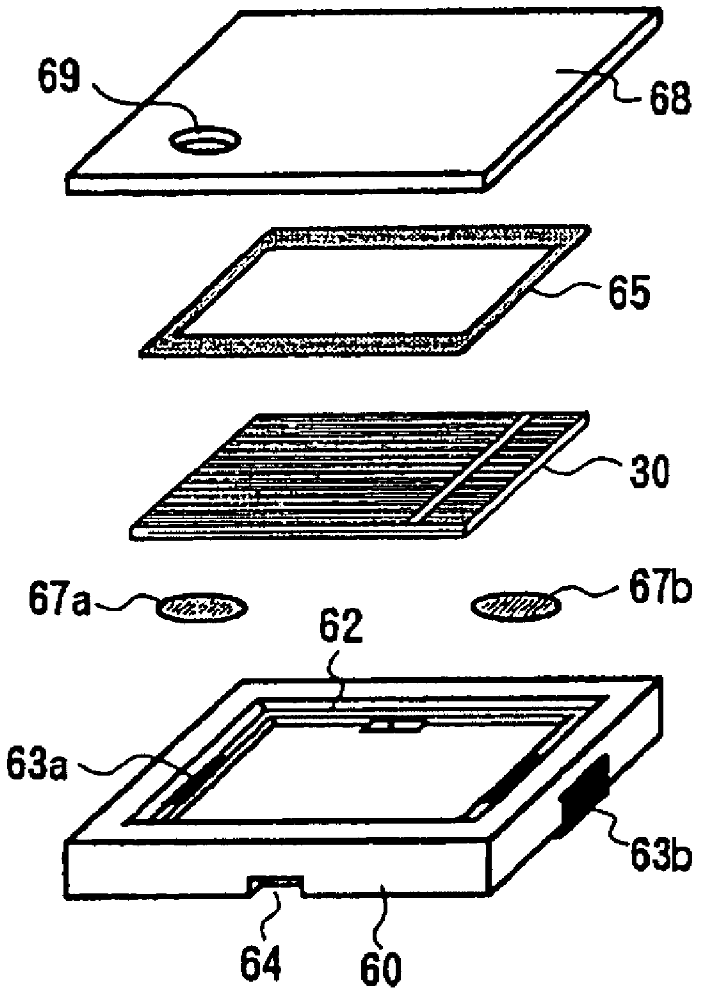
FIG. 23 is a exploded perspective view showing the piezoelectric electroacoustic transducer in accordance with a eleventh preferred embodiment of the present invention.

FIG. 23 shows a piezoelectric electroacoustic transducer in accordance with a eleventh preferred embodiment of the present invention. Since this preferred embodiment has substantially same structure as that shown in FIGS. 15 through 17, the same elements as those in FIGS. 15 through 17 are identified by the same reference numerals, to avoid repeated descriptions.

In this preferred embodiment, step-shaped supporting members 62 are provided all around the inner side surface of a substantially rectangular case 60. All of the four sides of a diaphragm 30 are supported on supporting member 62 by a supporting agent 65 such as an adhesive, or other suitable agent.

This preferred embodiment is also used as a sounder operable at a single frequency, such as a piezoelectric sounder. The diaphragm is used in the resonance frequency range.

The present invention is not limited to the above-described embodiments, but various changes and modifications may be made in the present invention without departing from the spirit and the scope thereof.

In the above-described preferred embodiments, an end surface electrode connected with an internal electrode is provided on the end surface of the diaphragm, and the internal electrode is extracted outside via the end surface electrode of a diaphragm. Alternatively, however, the internal electrode may be extracted outside via a through hole as disclosed in Japanese Unexamined Patent Application publication No. 61-205100, or may be extracted outside via a slit-shaped groove or slit-shaped hole.

In the above-described preferred embodiments, the diaphragm 1, 30, 30', 50, and 50' are made by laminating two or three ceramic green sheets via an electrode film, simultaneously firing this laminated body into a sintered body, and then polarizing this sintered laminated body. In place of this method, however, the diaphragm may be obtained by laminating two or three ceramic plates which has been previously fired and polarized, and adhering the laminated ceramic plates to each other. However, the former manufacturing method in which firing is performed after laminating ceramic sheets, is capable of making the diaphragm much thinner and yielding a higher sound pressure than the latter producing method in which the previously fired ceramic sheets are laminated. The former method, therefore, permits the diaphragm to have a superior electroacoustic conversion efficiency.

The diaphragm in accordance with preferred embodiments of the present invention is not limited to a diaphragm constituted exclusively of piezoelectric ceramic layers. A reinforced sheet such as a metallic film or resin sheet may be adhered to one side of the laminated body. Unlike the metallic plate used in a unimorph diaphragm, however, this reinforced sheet is used for preventing a laminated body from generating cracks or other structural defects. Preferably, the reinforced sheet used is such as not to hinder the bending vibration of the laminated body.

As is evident from the above description, in accordance with one aspect of preferred embodiments of the present invention, main surface electrodes are provided on the top and bottom surfaces of the laminated body including two or three piezoelectric ceramic layers, internal electrodes are provided between ceramic layers, and all of the ceramic layers are polarized in the same direction with respect to the thickness direction, and consequently by applying an alternating voltage between the main surface electrodes and the internal electrodes, the bottom ceramic layer contracts, for example, when the top ceramic layer expands, which causes the laminated body to generate a bending vibration in its entirety. The vibrational displacement of the present diaphragm is larger than that of the unimorph type diaphragm, which results in a increased sound pressure.

In addition, since all of the ceramic layers are polarized in the same direction with respect to the thickness direction, there is no need for a complicated interconnection between the main surface electrodes and the internal electrodes, unlike the conventional method. Bending vibration of the diaphragm is obtained by merely applying a voltage across the main surface electrodes and the internal electrodes. This results in simplification of the structure and reduction in the production cost.

What is claimed is:

1. A piezoelectric electroacoustic transducer comprising:

a laminated body having a top surface and a bottom surface and including at least two piezoelectric ceramic layers laminated together;

main surface electrodes each provided on the top surface and the bottom surface of said laminated body;

an internal electrode provided between any adjacent two of said at least two piezoelectric ceramic layers; and a case for accommodating the laminated body; wherein all of the ceramic layers are polarized in the same direction with respect to the thickness direction;

said laminated body vibrates in a bending vibration mode in response to an alternating voltage being applied across said main surface electrodes and said internal electrode; and the entire laminated body is sealed to a portion of the case.

2. A piezoelectric electroacoustic transducer as claimed in claim 1, wherein said internal electrode is connected with an end surface electrode provided on an end surface of said laminated body and an alternating voltage is applied across said end surface electrode and said two main surface electrodes.

3. A piezoelectric electroacoustic transducer as claimed in claim 1, wherein said laminated body is constructed of a sintered body including a laminated and sintered body of at least two ceramic green sheets and an electrode film and all ceramic layers are polarized in the same direction with respect to the thickness direction by applying a voltage across said main surface electrodes formed on the top and bottom surfaces of said laminated body.

4. A piezoelectric electroacoustic transducer as claimed in claim 2, wherein said laminated body is constructed of a sintered body including a laminated and sintered body of at least two ceramic green sheets and an electrode film and all ceramic layers are polarized in the same direction with respect to the thickness direction by applying a voltage across said main surface electrodes formed on the top and bottom surfaces of said laminated body.

5. A piezoelectric electroacoustic transducer comprising:

a laminated body including at least two piezoelectric ceramic layers that are laminated together;

top and bottom main surface electrodes provided on a top main surface and a bottom main surface of said laminated body; and an internal electrode provided between said at least two piezoelectric ceramic layers; wherein all of said at least two ceramic layers are polarized in the same direction with respect to a thickness direction of said laminated body;

said laminated body vibrates in a bending vibration mode in response to an alternating voltage being applied across said top and bottom main surface electrodes and said internal electrode;

said laminated body is configured in a substantially rectangular plate;

said top and bottom main surface electrodes are interconnected via a first end surface electrode provided on a first end surface of said laminated body;

said internal electrode is connected to a second end surface electrode provided on a second end surface of said laminated body opposed to said first end surface;

said top and bottom main surface electrodes are located in substantially rectangular regions surrounded by the first end surface and two end surfaces that are substantially perpendicular to the first end surface, and ends of said top and bottom main surface electrodes are arranged adjacent to the second end surface;

said internal electrode is located in a substantially rectangular region surrounded by the second end surface and the two end surfaces that are substantially perpendicular to the second end surface, and an end of said internal electrode is arranged adjacent to the first end surface; and auxiliary electrodes are provided in regions of the top and bottom main surfaces of said laminated body along the second end surface, the auxiliary electrodes are connected to said second end surface electrode and are spaced from said top and bottom main surface electrodes.

6. A piezoelectric electroacoustic transducer as claimed in claim 5, wherein said laminated body includes three ceramic layers; and a thickness of an intermediate ceramic layer of said three ceramic layers is between about 50% and about 80% of the overall thickness of said laminated body.

7. A piezoelectric electroacoustic transducer as claimed in claim 5, wherein said laminated body is constructed of a sintered body obtained by laminating at least two ceramic green sheets via an electrode film, and simultaneously firing the laminated green sheets; and all of the at least two ceramic layers are polarized in the same direction with respect to the thickness direction by applying a voltage across said top and bottom main surface electrodes.

8. A piezoelectric electroacoustic transducer as claimed in claim 6, wherein said laminated body is defined by a sintered body obtained by laminating three green sheets via electrode films, and simultaneously firing the laminated green sheets; and all of the three ceramic layers are polarized in the same direction with respect to the thickness direction by applying a voltage across said top and bottom main surface electrodes.

* * * * *